United States Patent
Viswanath et al.

[19]

[11] Patent Number: 6,049,217
[45] Date of Patent: Apr. 11, 2000

[54] THERMALLY ENHANCED TEST CONTACTOR

[75] Inventors: Ram S. Viswanath, Phoenix; Martin M. Maxwell; Navid Shahriari, both of Chandler, all of Ariz.

[73] Assignee: Intel Corporation, Santa Clara, Calif.

[21] Appl. No.: 09/001,081

[22] Filed: Dec. 30, 1997

[51] Int. Cl.[7] ....................................................... G01R 1/00
[52] U.S. Cl. ............................ 324/760; 324/761; 324/754
[58] Field of Search ..................................... 324/760, 754, 324/755, 756, 757, 758, 761

[56] References Cited

U.S. PATENT DOCUMENTS

| | | | |
|---|---|---|---|
| 4,839,587 | 6/1989 | Flatley et al. | 324/761 |
| 4,887,147 | 12/1989 | Friedman | 174/252 |
| 5,196,785 | 3/1993 | Douglas | 324/754 |
| 5,608,267 | 3/1997 | Mahulikar et al. | 257/796 |
| 5,822,848 | 10/1998 | Chiang | 29/827 |
| 5,847,366 | 12/1998 | Grunfeld | 219/497 |

*Primary Examiner*—Ernest Karlsen
*Assistant Examiner*—T. R. Sundaram
*Attorney, Agent, or Firm*—Blakely, Sokoloff, Taylor Zafman LLP

[57] ABSTRACT

A test contactor having a heat slug for removing heat from an electronic device engaging the contactor. The heat slug is positioned in the test contactor so that a thermally conductive surface of the heat slug will intimately contact a heat-radiating bottom surface of the electronic device when the electronic device is in position for testing by the test contactor. A separate heat slug may also be provided for contacting a heat-radiating top surface of the electronic device. Either or both of the heat slugs may be spring loaded or otherwise movably constrained to maximize surface contact with the electronic device by self-positioning when all elements are placed in proper test position. Improved thermal contact may also be achieved by the use of compliant material between the respective contact surfaces of the heat slug and electronic device. Failure induced by stress at the corners of the electronic device may be minimized by making the contact area of the heat slug smaller than the affected surface area of the electronic device. Heat transfer may be further improved by configuring the heat slug with cooling fins and by using convection flow past the heat slug.

20 Claims, 5 Drawing Sheets

THERMALLY ENHANCED TEST CONTACTOR

FIELD OF THE INVENTION

The present invention relates generally to testing of semiconductor devices and, more specifically, to a contactor which is used for purposes of testing semiconductor devices.

BACKGROUND OF THE INVENTION

Tape Automated Bonding (TAB) is a process that is used to interconnect a chip to a package. The TAB process involves bonding an integrated circuit (IC) device to a patterned metal on a polymer tape which typically consists of copper foil on a polyimide tape. Once the IC device is bonded to the tape the apparatus is commonly referred to as a Tape Carrier Package (TCP).

FIGS. 1A and 1B illustrate a top and side view of a typical prior art TCP 10, respectively. As shown in FIGS. 1A and 1B, the frontside of an integrated circuit device 12 is secured to the polyimide tape 18. The tape 18 is secured within a plastic housing/carrier 22 which provides structural support to the TCP. Bond pads 14 on the frontside of the integrated circuit device are bonded to copper leads 16 formed on the polyimide tape 18. The copper on the polyimide tape 18 is patterned to form the electrically conductive leads 16 which are used for power, ground, and signal distribution between IC device 12 and a substrate, such as a printed circuit board (PCB). Test pads 20 are provided along the outer periphery of TCP 10 to facilitate the electrical testing of IC device 12 before the TCP is shipped to the customer. A plastic encapsulant 26 covering the frontside surface 23 of device 12 provides protection to bond pads 14 and the frontside (active side) surface of the device. Alignment holes 28 in tape 18 facilitate the alignment of test pads 20 with the corresponding electrical interface structure of a test device (not shown).

The present invention is aimed at removing heat from the surface(s) of an integrated circuit device that is housed within a TCP during the functional testing of the integrated circuit device. The functional test is performed before a package is mounted to a printed circuit board. The purpose of the test is to check the functionality and to monitor the electrical performance of the integrated circuit. The environmental test is generally performed within a temperature controlled chamber. A vacuum pickup chuck is typically used to position the package within the chamber. The electrically testing of the integrated circuit is performed by positioning the package within the chamber such that the package contacts are in electrical contact with a corresponding set of contacts located on a contactor of a test apparatus. Information pertaining to the electrical performance of the device is gathered during the test. The information is then used to screen out bad devices and to classify the integrated circuits according to their operating frequency. This process is commonly referred to as "binning out."

It is commonly known that as the temperature of an integrated circuit rises, the frequency at which the device operates decreases. Therefore, it is important to control the temperature of the integrated circuit during the functional test to ensure that the device is appropriately separated or "binned" according to its operating frequency. It is also important to control the temperature of the integrated circuit since excessive temperatures may affect the performance of the circuit and cause permanent degradation of the device. In addition, it is desirable to hold the temperature of the integrated circuit device at a relatively constant temperature throughout the testing sequence.

The traditional method for cooling integrated devices within a TCP has been through convection heat transfer. Using this method, heat is dissipated from the integrated circuit through the outer surfaces of the device into still or moving air. As the integration level (i.e., the number of transistors per device) of integrated circuits increases, or the power requirements, or the operating speed of these integrated circuits increases, the amount of heat generated by these devices increases to a point where conventional convection based solutions are inadequate. This poses a particular problem when testing integrated circuit devices housed within TCPs due to the extremely low thermal mass of the package. If the integrated circuit device is not adequately cooled during the test, and is permitted to rise significantly above a designated test temperature, the device may be unnecessarily downgraded into a lower frequency bin. It is also important that the temperature of the integrated circuit device be maintained above the designated test temperature during the functional test sequence in order to ensure that the device is not improperly upgraded into a higher frequency bin.

Thus, what is needed is an apparatus and method for controlling the temperature of an integrated circuit device that solves the problems associated with testing a TCP.

SUMMARY OF THE INVENTION

The invention provides a test contactor having a heat slug for removing heat from an electronic device engaging the contactor.

BRIEF DESCRIPTION OF THE DRAWINGS

The present invention is illustrated by way of example and is not limited by the figures of the accompanying drawings, in which like references indicate similar elements, and in which.

DETAILED DESCRIPTION

An apparatus and method for removing heat from an integrated circuit device under test is described. In the following description, numerous specific details are set forth in order to provide a thorough understanding of the invention. However, it will be obvious to one of skill in the art that the invention may be practiced without these specific details. In other instances, well known elements have not been shown in particular detail in order to avoid unnecessarily obscuring the present invention.

As previously discussed, many modern integrated circuit devices have evolved to a point where convection heat transfer alone is unable to provide adequate cooling to the devices during the performance and functionality test of such devices. In accordance with the present invention a contactor having an integral heat slug is provided which facilitates the removal of heat from the backside of an integrated circuit device housed within a TCP under test.

Figure 1A:
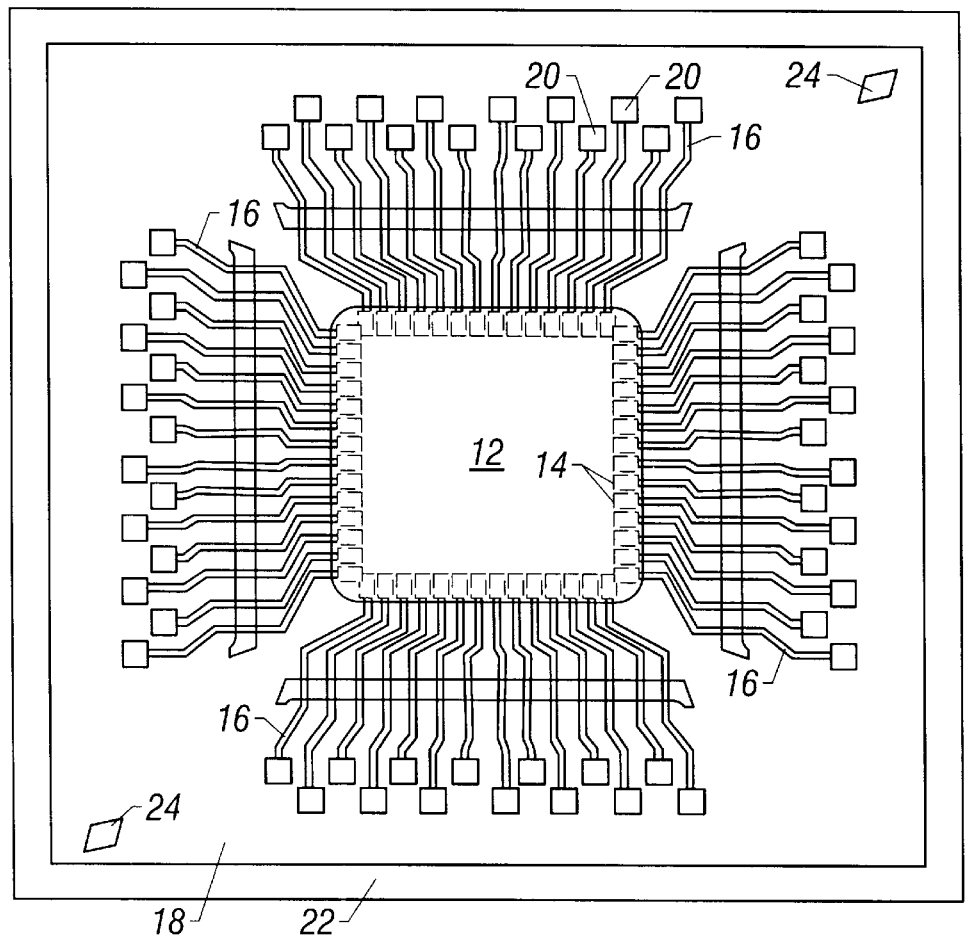
FIG. 1A illustrates a top view of a conventional Tape Carrier Package.
Figure 1B:
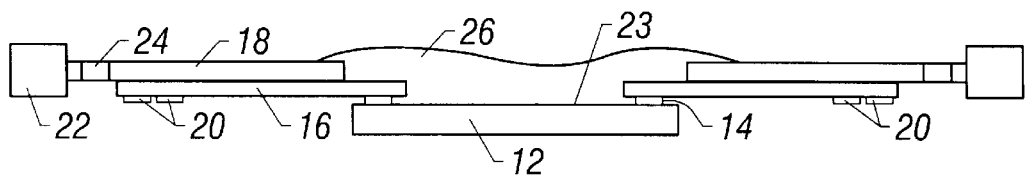
FIG. 1B illustrates the a side view of the Tape Carrier Package shown in FIG. 1A.
Figure 2A:
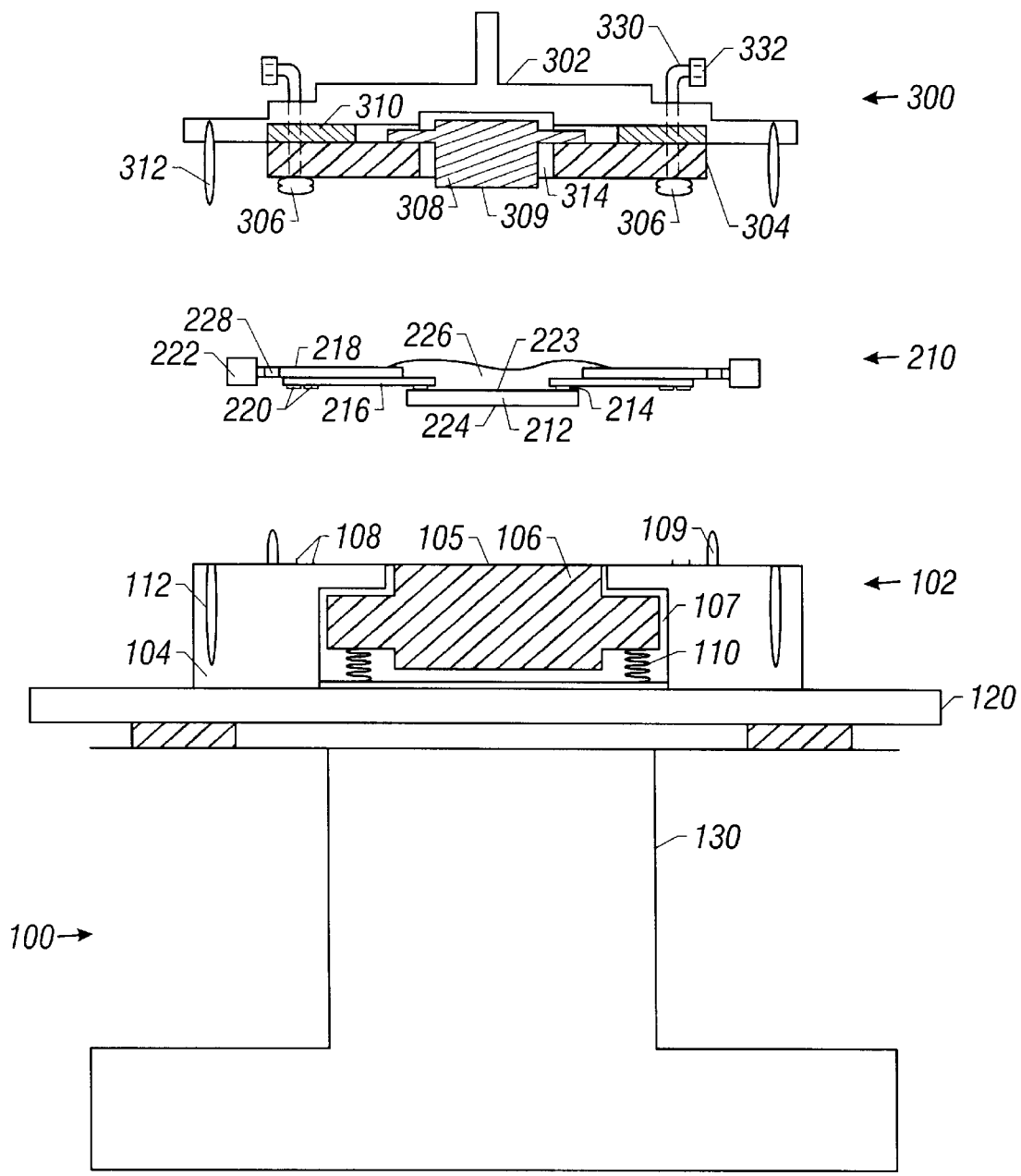
FIG. 2A is a side view of a test apparatus in one embodiment of the present invention.

FIG. 2A illustrates a test apparatus for testing a TCP 210. TCP 210 includes an integrated circuit device 212 whose frontside 223 is mounted to a polyimide tape 218 by bond pads 214. Copper leads electrically couple the integrated circuit device 212 to test pads 220 located at the periphery of the TCP. A plastic encapsulant 226 covering the frontside surface 223 provides protection to bond pads 214 and the frontside surface of the device. Alignment holes 228 in tape 218 facilitate the alignment of test pads 220 with the corresponding alignment formations 109 of the test contactor 102 which is described below. The polyimide tape 218 is secured within a plastic carrier 222 that provides structural support to the TCP.

The test apparatus includes a test unit 100 which is used to generate a series of test signals to test the performance of TCP 210 and integrated circuit device 212. Test unit 100 includes a test contactor 102 and a load board 120 that is mounted to a support structure 130. The test contactor 102 and load board 120 combination is typically referred to as the "Tester Interface Unit" (TIU). Contactor 102 generally includes a plastic body 104 having a plurality of electrical connectors 108 disposed along a top surface thereof. A heat slug 106 is provided within a cavity 107 of contactor 102 to facilitate the removal of heat from the backside surface 224 of integrated circuit device 212. In one embodiment, heat slug 106 is supported by springs 110 that permit the heat slug to pivot within cavity 107 when a force is applied to the top surface 105 of the heat slug. In lieu of using springs, bellows or other compliant materials/movable means may be used to support the heat slug within contactor 102.

The electrical connectors 108 of contactor 102 are electrically coupled to load board 120 at the contactor/load board interface. Load board 120 generally includes a multi-layer printed circuit board that couples the test unit 100 to the test contactor 102.

In accordance with the present invention, testing of TCP 210 includes positioning the TCP so that the test pads 220 contact the electrical connectors 108 of contactor 102 and holding the TCP in position such that the backside surface 224 of device 212 is maintained in intimate contact with the contact surface 105 of heat slug 106, while a series of test signals are applied to the package through the load board 120 and electrical connectors 108 of contactor 102. This results in the generation of heat which must be dissipated from the integrated circuit device 212 in order to conform to applicable test requirements and/or to maintain the temperature of the device within safe operating limits. Typically, the tester interface unit, which includes the test contactor 102 and the load board 120, is contained within a temperature controlled environmental chamber (not shown) that is maintained at a constant temperature. By providing a heat slug within contactor 102, the heat generated by integrated circuit device 212 during testing is dissipated through the backside of the device and into heat slug 106 to maintain the device 212 at desired temperature during the test sequence. In addition, by containing the TCP 210 and the tester interface unit completely within a constant temperature environmental chamber it is ensured that the electrical device is maintained above a certain minimum temperature during the entire test sequence.

Heat slug 106 provides contactor 102 with sufficient thermal mass for absorbing heat that is generated by integrated circuit device 212 while the device is being tested. Heat slug 106 comprises a material having a high thermal conductivity and a high thermal capacitance. For example, in one embodiment, heat slug 106 comprises copper. In another embodiment, heat slug 106 is made of aluminum. The heat slug may contain an inert plating, such as nickel, along contact surface 105 for wear resistance. The size and shape of heat slug 106 is not limited by the present invention. It is only important that the thermal mass of the heat slug be high enough to absorb the heat that is generated by the integrated circuit device 212 during testing. Additionally, a contact surface is needed for interfacing with a surface of the integrated circuit device.

In one embodiment, electrical connectors 108 comprise pogo pins. It is appreciated however, that electrical connectors 108 may include any type of connector that is capable of providing a temporary, reliable, and repeatable electrical connection between contactor 102 and a TCP.

The TCP 210 is positioned relative to contactor 102 with the use of a pickup chuck 300. Pickup chuck 300 includes a mounting structure 302, a body 304, and a compliant material 310 positioned between structure 302 and body 304 that permits relative motion between body 304 and mounting structure 302.

A cavity 314 is provided within a center portion of pickup chuck 300 for accommodating a heat slug 308 that is movably mounted to the pickup chuck. A portion of heat slug 308 protrudes from the body 304. In one embodiment, a biasing element, such as a spring (not shown), is provided to continuously bias the heat slug 308 out of the body 304. Suction pads 306 on body 304 are coupled to a vacuum source through vacuum ports 330 and fittings 332. The suction pads 306 are used to hold the TCP 210 on the pickup chuck. Pickup chuck 300 is positioned to retrieve TCP 210 so that when a negative pressure is applied to suction pads 306, the TCP 210 is retained on the pickup chuck. Prior to retrieving TCP 210, the contact surface 309 of heat slug 308 is aligned with the frontside surface 223 of integrated circuit device 212. As pickup chuck 300 is lowered into position to retrieve TCP 210, the contact surface 309 of heat slug 308 initially makes contact with the encapsulant 226 positioned over the frontside surface 223 of device 212. Pickup chuck 300 is further lowered so that suction pads 306 contact the carrier 222 of the TCP 210. The movable nature of heat slug 308 ensures that a maximum surface area contact is established between the contact surface 309 of heat slug 308 and the frontside surface area 223 of TCP 210.

The manner in which heat slug 308 is mounted to pickup chuck 300, in combination with the pivotal arrangement of mounting structure 302 and body 304, provides the pickup chuck 300 with a self-planarization feature. This feature enhances the heat transfer capability of the apparatus by maximizing the contact surface area between the contact surface 309 of heat slug 308 and the frontside of TCP 210.

It is critical to provide mechanical support (backing) to the TCP device in the carrier to ensure good thermal contact between the contact surface 105 of the contactor heat slug 106 and the backside surface 224 of integrated circuit device 212. Although the pickup chuck 300 has been described as having a heat slug to provide such support, the use of a thermally conductive material for heat slug 210 is not required. It is only important that a substantially rigid support structure be provided to ensure good thermal contact between device 212 and heat slug 106.

After the TCP 210 is located within pickup chuck 300, the pickup chuck is lowered to position the TCP in contact with contactor 102. Guide members 312 on pickup chuck 300 and guide apertures 112 in contactor 102 are used to ensure the proper alignment of the pickup chuck and contactor during the positioning of TCP 210. The manner in which heat slug 106 is mounted within contactor 102 provides the heat slug with a self-planarization feature. This feature enhances the heat transfer capability of the heat slug 106 by maximizing the contact surface area between heat slug 106 and the backside surface 224 of integrated circuit device 212. Additionally, this feature ensures that a good surface contact is achieved between heat slug 106 and the backside of device 212 even when the planarity of the TCP is skewed.

Thus, in one embodiment of the present invention, heat generated during testing of integrated circuit device 212 is transferred by conduction from the backside surface 224 of device 212 into heat slug 106 and also from the frontside 223 of device 212 through the encapsulent 226 and into the heat slug 308. It is important to note, however, that the present invention does not require the use of a heat slug on pickup chuck 300, nor is the invention limited by the manner in which the TCP 210 is positioned and held in contact with contactor 102. It is only important that the pickup chuck provide mechanical support (backing) to the TCP device. The use of a thermally conductive slug in the pickup chuck further enhances the heat transfer capability of the device. Note, however, that a plastic slug or other rigid device may be used to support the TCP device. A salient feature of the present invention is the use of a heat slug within contactor 102 which permits the removal of heat from the surface of an integrated circuit device during the testing of the device.

Figure 2B:
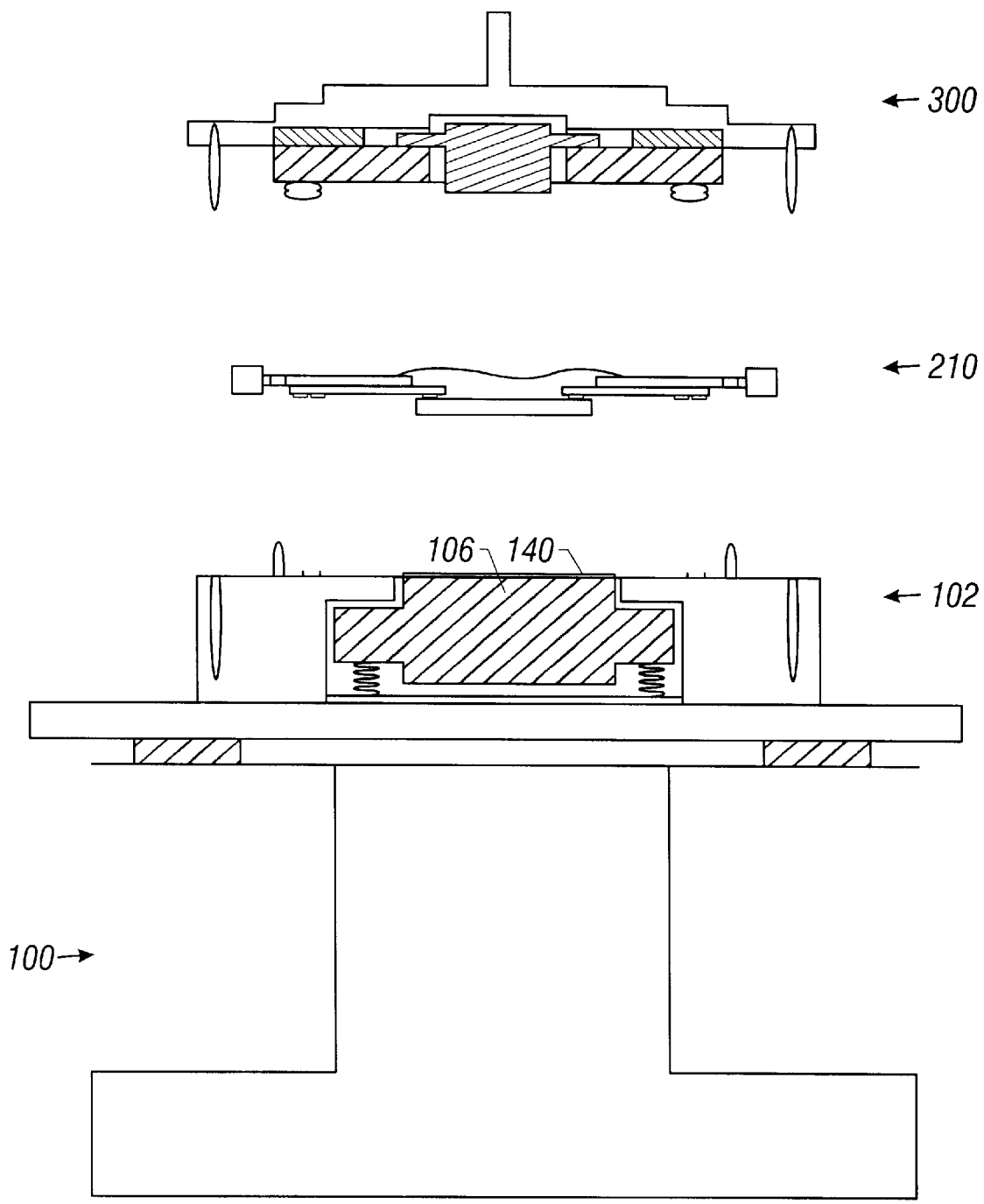
FIG. 2B is a side view of a test apparatus in another embodiment of the present invention.

In accordance with one embodiment of the invention, a compliant and thermally conductive material 140 is provided along the contact surface 105 of heat slug 106 as shown in FIG. 2B. Compliant material 140 helps to maximize the contact surface area between the heat slug 106 and integrated circuit device 212. The compliant material 140 also acts to cushion the backside surface 224 of device 212 from the hard contact surface of heat slug 106, thereby reducing the likelihood that the integrated circuit device 212 will be damaged during the testing of the device.

Figure 2C:
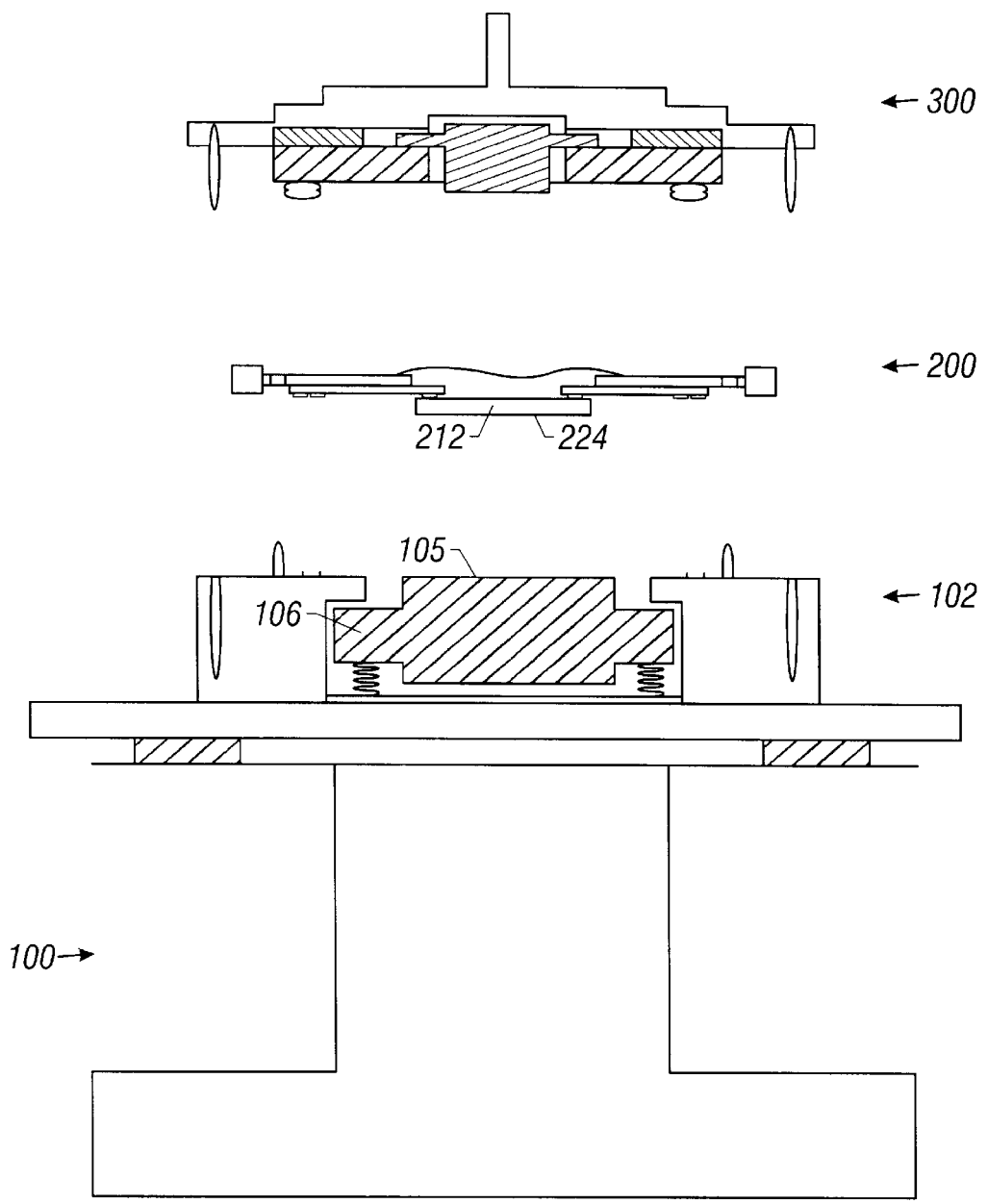
FIG. 2C is a side view of a test apparatus in another embodiment of the present invention.

It is known that exposed silicon dice are generally susceptible to cracking at or near the edges of the dice where stress concentration and the possibility of mechanical damage are at their highest. Cracks formed along the edges tend to propagate through the device and may ultimately result in a device failure when subjected to thermal/mechanical stresses. It is therefore desirable to minimize any external contact with the edges of the integrated circuit during the manufacture and testing of the devices. In one embodiment of the present invention, heat slug 106 comprises a stepped configuration wherein the contact surface 105 has a reduced surface area. Hence, in accordance with one implementation of the present invention, the contact surface 105 of heat slug 106 is sized to be smaller than the backside surface 224 of integrated circuit device 212. (See FIG. 2C.) Thus, when the backside surface 224 of integrated circuit device 212 is brought into contact with the contact surface 105 of heat slug 106, the edges of device 212 do not make contact with heat slug 106.

Figure 3:
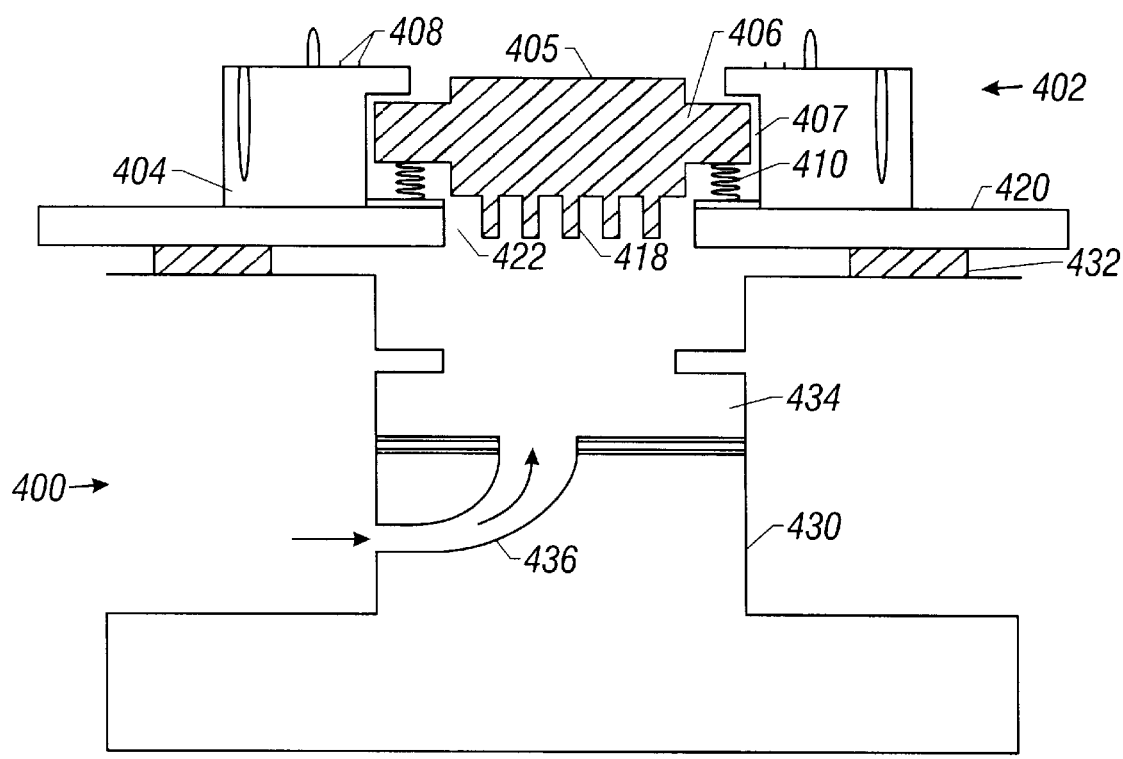
FIG. 3 is a side view of a test head in yet another embodiment of the present invention.

Turning now to FIG. 3, a test head 400 in another embodiment of the present invention is shown. Test head 400 includes a support structure 430 onto which is mounted a load board 420 and a contactor 402. Seals 432 are disposed between the support structure 430 and load board 420 to provide an air tight seal at the interface. Contactor 402 includes a body 404 having a plurality of electrical contact formations 408 disposed along a surface thereof. A heat slug 406 is movably mounted within a cavity 407 of contactor 402. In one embodiment, heat slug 406 is supported by a plurality of springs 410 which permit the heat slug to pivot when a test device is brought into contact with contact surface 405. Heat slug 406 includes a set fins 418 for increasing the heat transfer surface area of the heat slug. An opening 422 is provided in load board 420 to permit the fins to be exposed to a cooling chamber 434 located within support structure 430.

In one embodiment, a fluid, such as air or nitrogen, is pumped into cooling chamber 434 through a temperature controlled conduit 436. A nozzle or other flow directing device (not shown) may be connected to conduit 436 to direct the high velocity cooling medium over fins 418. Preferably, the temperature of the cooling medium is maintained at the desired test temperature to prevent the device from falling below the desired test temperature. For example, when it is desirable to hold the integrated circuit device at a temperature of 100° C. during the testing of the device, the temperature of the cooling medium is controlled to a temperature of approximately 100° C.

Thus, a contactor, and a contactor in combination with the pickup chuck have been described. Although the present invention has been described with reference to specific exemplary embodiments, it will be evident that various modifications and changes may be made to these embodiments without departing from the broader spirit and scope of the invention. It is also important to note that the present invention is not limited to the testing of integrated circuits housed within a TCP. It is contemplated that the contactor of the present invention may be used to test integrated circuit devices housed within other types of packages. Moreover, it is appreciated that the present invention may be used to remove heat from other electronic or electrical devices. Accordingly, the specifications and drawings are to be regarded in an illustrative rather than a restrictive sense.

What is claimed:

1. A test contactor comprising:
   a body having a plurality of electrical connectors disposed along a first surface thereof; and
   a heat slug movably constrained within a cavity of said body, said heat slug having a top contact surface that is substantially parallel to said first surface.

2. The test contactor of claim 1 wherein said heat slug has fins protruding from a bottom surface thereof.

3. The test contactor of claim 1 wherein said heat slug is biased toward said first surface.

4. The test contactor of claim 1 wherein said electrical connectors comprise pogo pins.

5. An apparatus for testing an integrated circuit device comprising:
   a tester;
   a test contactor having a plurality of electrical connectors disposed along a top surface thereof and a first heat slug movably constrained within a cavity of said contactor having a contact surface for contacting a first surface of said integrated circuit device, said contact surface being substantially parallel to said top surface of said contactor; and
   a load board electrically coupling said electrical connectors to said tester.

6. The test apparatus of claim 5 wherein said first heat slug includes fins.

7. The test apparatus of claim 5 further comprising a fluid moving system for producing a fluid flow across said first heat slug.

8. The test apparatus of claim 6 further comprising a fluid moving system for producing a fluid flow across said fins.

9. The test apparatus of claim 5 wherein said heat slug is biased toward said first surface.

10. The test apparatus of claim 5 wherein said contact surface of said first heat slug is smaller than said first surface of said integrated circuit device.

11. The test apparatus of claim 5 further comprising a pickup chuck for positioning said integrated circuit device into contact with said contactor, said pickup chuck having a second heat slug for contacting a second surface of said integrated circuit device.

12. The test apparatus of claim 11 wherein said second heat slug is movably mounted to said pickup chuck.

13. A test contactor in combination with a pickup chuck for testing a integrated circuit device said test contactor comprising:
   a first body with a surface having a set of electrical contacts disposed thereon and a first heat slug disposed within a cavity of said first body, said first heat slug having a contact surface for contacting a first surface of said integrated circuit device; and said pickup chuck comprising:
   a second body and a second heat slug coupled to said body, said second heat slug having a surface for contacting a second surface of said integrated circuit device.

14. The combination of claim 13 wherein said first heat slug is movable within said cavity.

15. The combination of claim 13 wherein said second heat slug is moveably coupled to said second body.

16. The combination of claim 13 wherein said first heat slug has fins.

17. The combination of claim 13 wherein said contact surface of said first heat slug is smaller than said first surface of said integrated circuit device.

18. The combination of claim 14 wherein said first heat slug is biased toward said first surface.

19. A method for controlling the temperature of an integrated circuit device housed within a Tape Carrier Package under test, said method comprising the steps of:

engaging said package with a test contactor such that a set of test pads on said package contact a corresponding set of electrical connectors on a top surface of said contactor and such that a first surface of the integrated circuit device is placed in thermal contact with a heat slug movably constrained within a cavity of said contactor and biased toward said first surface.

20. The method of claim 19 further comprising the step of passing a fluid over a surface of said heat slug.

* * * * *